United States Patent
Mizuno et al.

(10) Patent No.: US 7,206,671 B2
(45) Date of Patent: Apr. 17, 2007

(54) MOUNTING MACHINE AND CONTROLLER FOR THE MOUNTING MACHINE

(75) Inventors: Toru Mizuno, Tokyo (JP); Masatoshi Ito, Tokyo (JP); Masaaki Kaneko, Tokyo (JP); Hiroshi Ikeda, Tokyo (JP)

(73) Assignee: TDK Corporation, Tokyo (JP)

( * ) Notice: Subject to any disclaimer, the term of this patent is extended or adjusted under 35 U.S.C. 154(b) by 283 days.

(21) Appl. No.: 10/521,457

(22) PCT Filed: Aug. 18, 2003

(86) PCT No.: PCT/JP03/10411

§ 371 (c)(1),
(2), (4) Date: Jan. 18, 2005

(87) PCT Pub. No.: WO2004/019669

PCT Pub. Date: Mar. 4, 2004

(65) Prior Publication Data

US 2005/0241143 A1    Nov. 3, 2005

(30) Foreign Application Priority Data

Aug. 21, 2002    (JP)    ............... 2000-240588

(51) Int. Cl.
G05D 1/02    (2006.01)
(52) U.S. Cl. ............... 700/305; 29/739; 29/834
(58) Field of Classification Search ............... 700/302; 29/739, 834
See application file for complete search history.

(56) References Cited

U.S. PATENT DOCUMENTS

| 5,491,889 A | 2/1996 | Hundt et al. |
| 5,657,533 A | 8/1997 | Fukui et al. |
| 5,850,683 A | 12/1998 | Okazaki et al. |
| 6,012,222 A | 1/2000 | Asai et al. |
| 6,240,628 B1 | 6/2001 | Yoshida et al. |
| 6,282,779 B1 | 9/2001 | Nakano et al. |
| 6,293,006 B1 | 9/2001 | Takeda et al. |
| 6,389,256 B2 | 5/2002 | Song et al. |

FOREIGN PATENT DOCUMENTS

| JP | 07-101797 | 4/1995 |
| JP | 08-051297 | 2/1996 |
| JP | 09-148790 | 6/1997 |
| JP | 10-209680 | 8/1998 |
| JP | 2000-22396 | 1/2000 |
| JP | 2000-133995 | 5/2000 |
| JP | 2000-174498 | 6/2000 |
| JP | 2001-203498 | 7/2001 |
| JP | 2001-210995 | 8/2001 |
| JP | 2001-267728 | 9/2001 |
| JP | 2002-118153 | 4/2002 |

*Primary Examiner*—Leo Picard
*Assistant Examiner*—Sheela S. Rao
(74) *Attorney, Agent, or Firm*—Oblon, Spivak, McClelland, Maier & Neustadt, P.C.

(57) ABSTRACT

Provided is a mounting apparatus which enables high levels of both maintenance/improvement of product quality and reduction of product cost by reliably preventing accidental contact of a mounting part with a mounting target part while enhancing the productivity.

8 Claims, 9 Drawing Sheets

FIG. 10A  WHEN THERE IS DEVIATION OF TRANSFER POSITION AND CONTACT POSITION (DISTANCE IS SHORT)
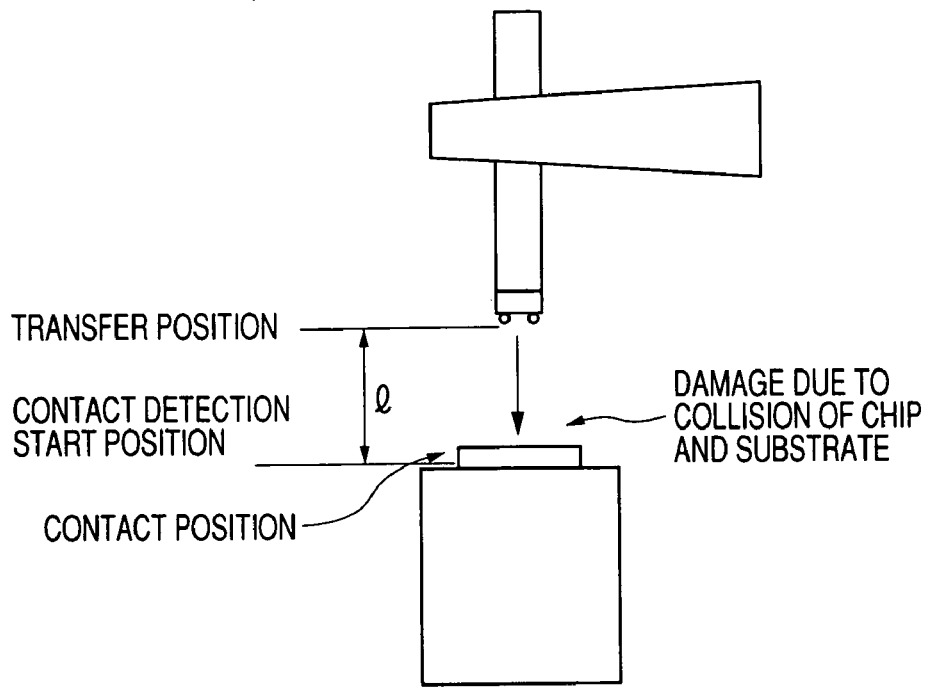
FIG. 10B  WHEN THERE IS DEVIATION OF TRANSFER POSITION AND CONTACT POSITION (DISTANCE IS LONG)
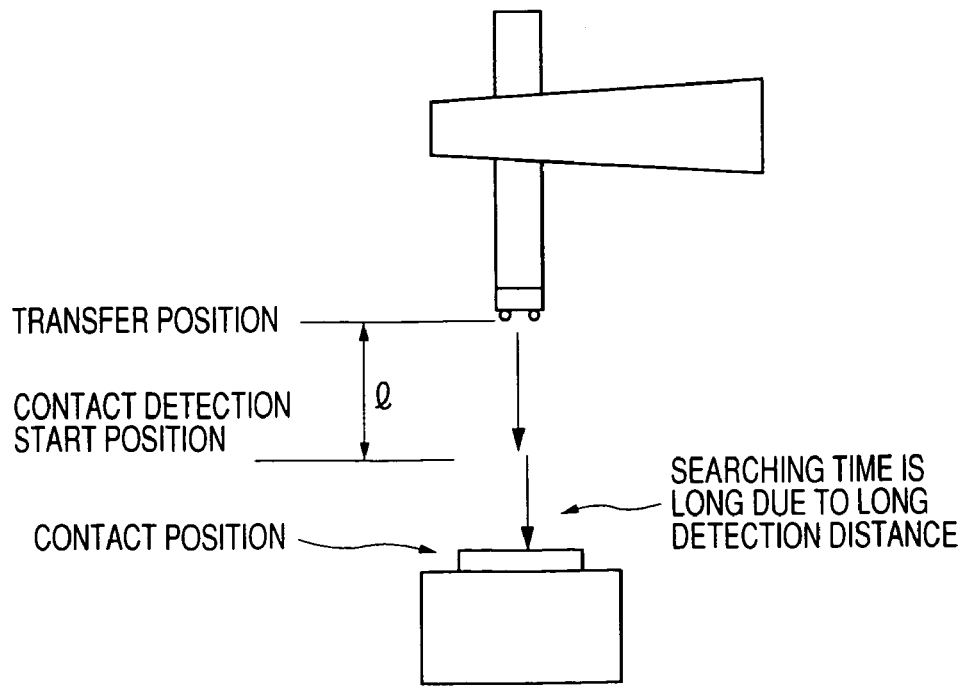

MOUNTING MACHINE AND CONTROLLER FOR THE MOUNTING MACHINE

TECHNICAL FIELD

The present invention relates to a mounting apparatus and a control apparatus for performing a predetermined processing, with a mounting part (an electronic part, such as a flip chip) and a mounting target part (such as a substrate) being in contact with each other in a predetermined manner, as in the case of mounting a mounting part on a mounting target part.

BACKGROUND ART

Conventionally, in an apparatus of this type, an electronic part held by a chip holding tool is lowered toward a substrate, and ultrasonic bonding is started when the electronic part is brought into contact with the substrate. Accordingly, it is necessary to detect the contact position. In order to make the tact time as short as possible, a chip holding tool is first lowered at a relatively high speed from a transfer position (the initial position of the chip holding tool, indicated by symbol A in FIG. 2) by a predetermined distance (hereinafter also referred to as the initial moving distance or the initial moving amount, which is indicated by symbol 1 in FIGS. 2 and 9). Thereafter, for the purpose, for example, of enhancing the accuracy with which the contact position is detected, the tool is lowered at a relatively low speed until the contact start, detecting the contact through a contact detecting device (a load cell or the like), etc.

However, in this conventional method, due to thermal expansion of the substrate holding portion (substrate holding means) and product variation (dimensional deviation), mounting errors, etc. of the electronic part and the substrate, variation is generated in the distance between the transfer position A and the substrate, which may lead to the following problem.

That is, to achieve an improvement in terms of productivity by shortening the tact time, it is general practice to set the initial moving distance 1 (the distance through which the chip holding tool is moved at a relatively high speed) to a predetermined distance. If, however, there is such variation as mentioned above, the distance between the transfer position A and the substrate may become shorter, and, as shown in FIG. 10A, the electronic part and the substrate may collide with each other, resulting in a defective product or a deterioration in the contact position detecting accuracy since a sufficient contact detection distance Ls (see FIG. 2) cannot be ensured.

On the other hand, when the distance from the transfer position A to the substrate is rather long due to the variation as mentioned above, the contact detection distance (searching distance) through which the tool is moved at a relatively low speed for contact detection after the movement through the initial moving distance 1 becomes rather long as shown in FIG. 10B, resulting in an increase in tact time and a deterioration in productivity.

In view of this, in order to avoid inadvertent contact of the electronic part with the substrate and a deterioration in contact position detection accuracy while maintaining high productivity, it might be possible to correct the initial moving distance 1 according to the above-mentioned variation, etc.

For example, Japanese Patent Application Laid-Open No. 2000-174498 discloses a system in which the above-mentioned initial moving distance is corrected based on the contact start position as detected with the first substrate, using the corrected moving distance for the mounting on the substrates from the second one onwards.

However, in the above system, the warpage of the substrates from the second one onward is regarded as practically the same as the warpage of the first substrate, using the correction result obtained with respect to the first substrate for the substrates from the second one onward, too, with the result that a sufficient correction accuracy cannot be ensured.

DISCLOSURE OF THE INVENTION

The present invention has been made in view of the above problem in the prior art. It is an object of the present invention to provide a mounting apparatus and a control apparatus for the mounting apparatus in which it is possible, for example, to reliably prevent the mounting part from inadvertently coming into contact with the mounting target part, thereby making it possible to simultaneously attain, at a high level, an improvement in terms of product quality and its maintenance and a reduction in product cost while achieving an enhancement in productivity.

To attain the above object, according to one aspect of the present invention, there is provided a mounting apparatus including: a mounting part holding means for holding a mounting part; a mounting target part holding means for holding a mounting target part; a control means for moving one of the mounting part holding means and the mounting target part holding means to bring the mounting part held by the mounting part holding means and the mounting target part held by the mounting target holding means into contact with each other in a predetermined fashion for a predetermined processing; a contact start detecting means for detecting start of contact between the mounting part and the mounting target part; and a contact start position detecting means for detecting a contact start position where the start of contact between the mounting part and the mounting target part is detected by the contact start detecting means, in which the control means includes: an initial movement control means for moving the one of the means to be moved from a predetermined initial position toward the other means by a predetermined initial moving amount; a contact movement control means for moving, after movement by the initial movement means by the predetermined initial moving amount, the one of the means to be moved toward the other means in a manner different from the movement by the initial movement means, bringing the mounting part into contact with the mounting target part; and a correction means for correcting, each time the contact start position is detected by the contact start position detecting means, one of the predetermined initial moving amount and a predetermined initial moving amount that is obtained after correction by the correction means based on the contact start position detected.

In this construction, the position at which the mounting part actually starts to come into contact with the mounting target part, is detected, and, based on the detection result, it is possible to correct the contact detection start position in the next mounting processing and, by extension, the initial moving amount, so that it is possible to correct the contact detection start position (search start position) with high accuracy for each mounting processing, whereby it is possible to minimize the tact time while maintaining a desired level of contact detection accuracy, making it possible to simultaneously maintain and improve the product quality and to reduce the product cost.

Further, the contact start detecting means can be a means for detecting contact start based on a contact pressure generated between the mounting part and the mounting target part.

Further, the contact start position detecting means can be a means for detecting the contact start position based on a moving amount by which the one of the means to be moved moves from a predetermined reference position until the detecting of the start of contact between the mounting part and the mounting target part.

In further aspect of the mounting apparatus, the mounting further includes: a pressurizing means for causing an output member to act on one of the mounting part and the mounting target part to impart a predetermined pressurizing force between the mounting part and the mounting target part in contact with each other; a lock means for supporting as a support portion a halfway portion of the output member from a direction opposite to a pressurizing direction to regulate relative movement of the output member in the pressurizing direction with respect to the support portion; and a pressurizing force detecting means for detecting a pressurizing force actually acting on the output member between an end portion of the output member acting on the one of the mounting part and the mounting target part and a position of a cross section substantially perpendicular to the pressurizing direction of the output member including a support position of the lock means, in which, with the lock means imparting a predetermined pressurizing force to the output member of the pressurizing means while supporting the output member, the control means causes the initial movement control means and the contact movement control means to move one of the mounting part holding means and the mounting target part holding means, and in which the pressurizing force detecting means is caused to function as the contact start detecting means.

In this construction, when the pressurizing force detecting means is caused to function as the contact start detecting means, and the contact start is detected by utilizing the detection result obtained by the pressurizing force detecting means, the deformation amount of the output member generated by the contact of the mounting part with the mounting target part is detected as the raising amount of the output member, and taking into account the detection result, the actual contact position can be detected more accurately, so that it is possible to correct with higher accuracy the contact detection start position (the search start position) in the next mounting processing. Thus, it is possible to correct with higher accuracy the contact detection start position for each mounting processing, whereby it is possible to simultaneously attain, with still higher accuracy, an improvement in the product quality and maintenance thereof and a reduction in the product cost.

In further aspect of the mounting apparatus, the mounting apparatus further includes: a raising amount detecting means for detecting, as a raising amount, an amount by which the output member is deformed between a contact side end portion of the output member and the support portion due to a contact pressure generated when the mounting part comes into contact with the mounting target part; and a contact start position correcting means for correcting a contact start position detected by the contact start position detecting means based on the raising amount, in which, each time the contact start position is detected by the contact start position detecting means, the correction means corrects one of the predetermined initial moving amount and a predetermined initial moving amount that is obtained after correction by the correction means based on the contact start position corrected by the contact start position correcting means.

Further, the raising amount detecting means can be a means for detecting the raising amount by a linear gauge.

According to another aspect of the present invention, there is provided a control apparatus for a mounting apparatus, including: a control means for moving one of a mounting part holding means and a mounting target part holding means to bring a mounting part held by the mounting part holding means and a mounting target part held by the mounting target part holding means into contact with each other in a predetermined manner for a predetermined processing, in which information from a contact start detecting means for detecting start of contact between the mounting part and the mounting target part, and information from a contact start position detecting means for detecting a contact start position where the start of contact between the mounting part and the mounting target part is detected by the contact start detecting means, are input to the control means, and in which the control means includes: an initial movement control means for moving the one of the means to be moved from a predetermined initial position toward the other means by a predetermined initial moving amount; a contact movement control means for moving, after movement by the predetermined initial moving amount by the initial moving means, the one of the means to be moved toward the other means in a manner different from that of the movement by the initial moving means, bringing the mounting part into contact with the mounting target part; and a correction means for correcting, each time the contact start position is detected by the contact start position detecting means, one of the predetermined initial moving amount and a predetermined initial moving amount that is obtained after correction by the correction means based on the contact start position detected.

In this construction, the position at which the mounting part actually starts to come into contact with the mounting target part is detected, and, based on the detection result, it is possible to correct the contact detection start position in the next mounting processing and, by extension, the initial moving amount, so that it is possible to correct with high accuracy the contact detection start position for each mounting processing, whereby it is possible to minimize the tact time while maintaining a desired level of contact detection accuracy, making it possible to simultaneously attain an improvement in the product quality and maintenance thereof and a reduction in the product cost.

In further aspect of the control apparatus for a mounting apparatus, the mounting apparatus includes: a pressurizing means for causing an output member to act on one of the mounting part and the mounting target part to impart a predetermined pressurizing force between the mounting part and the mounting target part in contact with each other; a lock means for supporting as a support portion a halfway portion of the output member from a direction opposite to a pressurizing direction to regulate relative movement of the output member in the pressurizing direction with respect to the support portion; and a pressurizing force detecting means for detecting a pressurizing force actually acting on the output member between an end portion of the output member acting on the one of the mounting part and the mounting target part and a position of a cross section substantially perpendicular to the pressurizing direction of the output member including a support position of the lock means, in which information from a raising amount detecting means is input to the control apparatus, the raising amount detecting means being for detecting as a raising amount an amount by which the output member is deformed between a contact side end portion of the output member and the support portion due to a contact pressure generated when the mounting part and the mounting target part are brought into contact with each other, in which the control means is equipped with a contact start position correcting means for correcting the contact start position detected by the contact start position detecting means based on the raising amount, and in which, each time a contact start position is detected by the contact start position detecting means, the correction means corrects one of the predetermined initial moving amount and a predetermined initial moving amount that is obtained after correction by the correction based on the contact start position corrected by the contact start position correcting means.

In this construction, also when the pressurizing force detecting means is caused to function as the contact start detecting means, and the contact start is detected by utilizing the detection result obtained by the pressurizing force detecting means, the deformation amount of the output member generated through contact of the mounting part with the mounting target part is detected as the raising amount of the output member, and, taking into account the detection result, the actual contact position can be detected with higher accuracy, so that it is possible to correct with higher accuracy the contact detection start position (the search start position) in the next mounting processing. Thus, it is possible to correct with higher accuracy the contact detection start position for each mounting processing, whereby it is possible to simultaneously attain, at a still higher level, an improvement in the product quality and maintenance thereof and a reduction in the product cost.

BRIEF DESCRIPTION OF THE DRAWINGS

FIGS. 6A, 6B, and 6C are diagrams illustrating the load detection mechanism of the load detecting device of the second embodiment, of which FIG. 6A shows the state at the time of contact start, FIG. 6B shows the state in which transition to the initial load condition has been effected, and FIG. 6C shows the state in which pressurizing control is possible by a reciprocating movement power source in the initial load condition;

FIGS. 10A and 10B are diagrams illustrating the problems in a conventional apparatus.

BEST MODE FOR CARRYING OUT THE INVENTION

Embodiments of the present invention will now be described with reference to the accompanying drawings.

First, a first embodiment of the present invention will be described.

Figure 1:
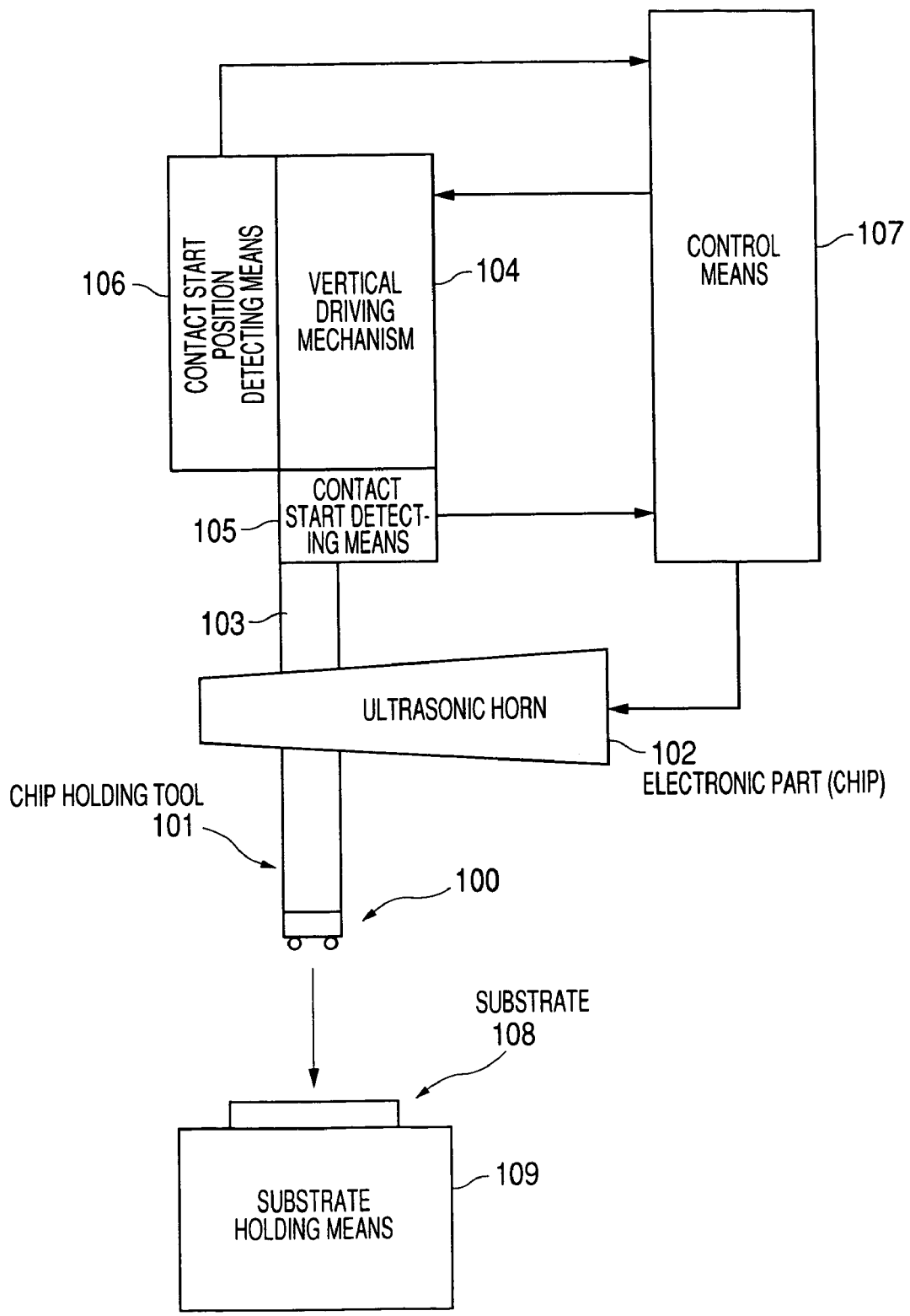
FIG. 1 is a block diagram showing a first embodiment of the present invention.

As shown in FIG. 1, which is a block diagram, in a mounting apparatus according to the first embodiment, a chip holding tool 101 holding an electronic part 100 is mounted to an ultrasonic horn 102, which is mounted to a shaft 103. The shaft 103 is connected to a vertical driving mechanism 104 and is capable of moving vertically as seen in FIG. 1. Further, a contact start detecting means 105 including a load cell, etc. is provided on the shaft 103, whereby it is possible to detect contact between the electronic part 100 and a substrate 108 held by a substrate holding means 109 (The substrate 108 may allow mounting of one of a plurality of electronic parts). The chip holding tool 101 corresponds to the means for holding the mounting part, and the substrate holding means 109 corresponds to the means for holding the mounting target part.

Figure 2:
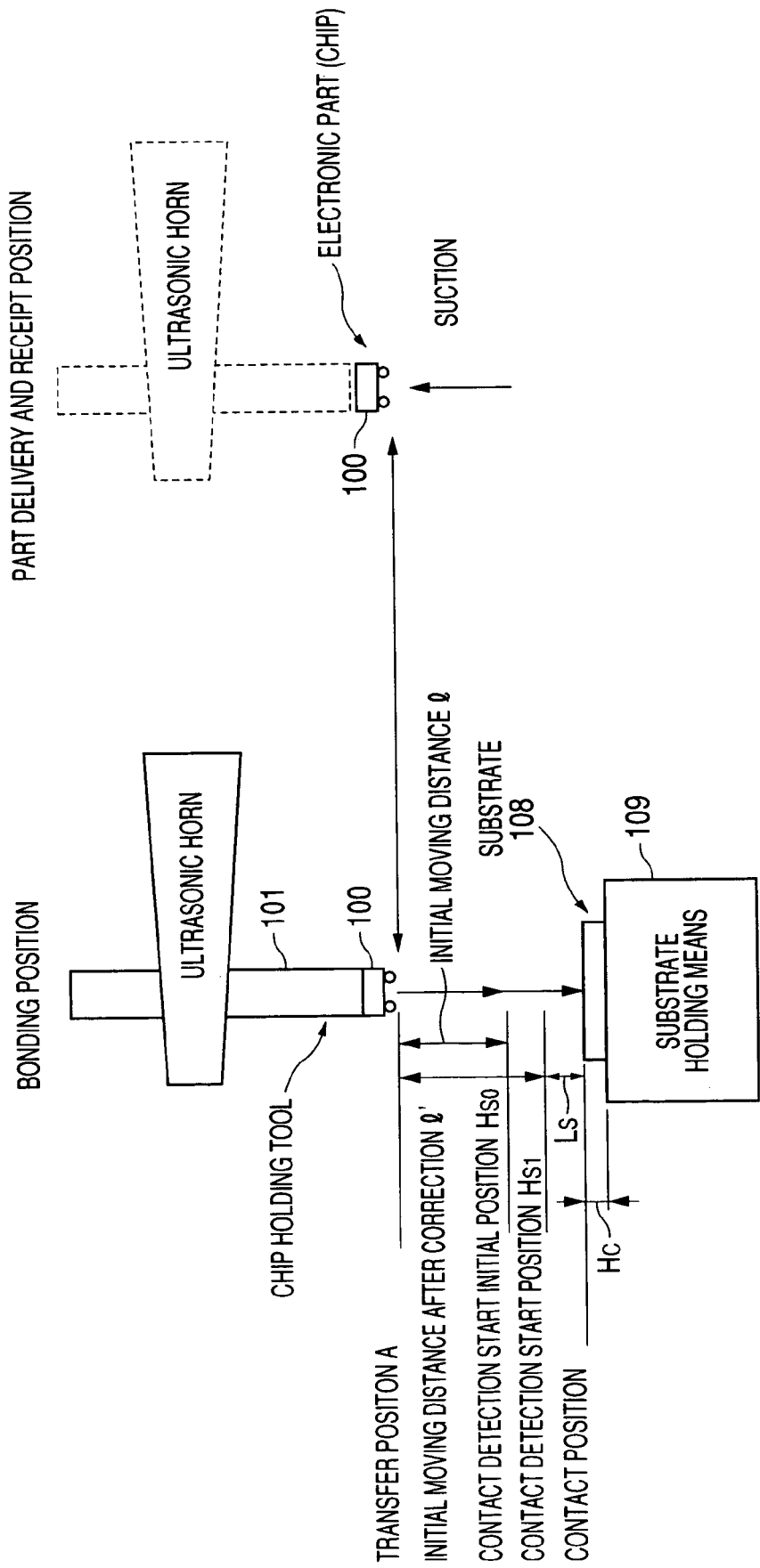
FIG. 2 is a diagram schematically illustrating the mounting operation in the first embodiment.

Further, there is provided a contact start position detecting means 106 which can detect the position at which the electronic part 100 and the substrate 108, held by the substrate holding means 109, come into contact with each other, that is, the contact position Hc (the distance from a predetermined reference position of the substrate holding means 109 to the surface of the substrate 108 which is to undergo processing; see FIG. 2) on the basis, for example, of the amount by which the shaft 103 (the vertical driving mechanism 104) moves in the height direction from the transfer position A (which amount can, for example, be obtained by detecting the driving amount of the vertical driving mechanism 104 through an encoder or the like, or can be detected directly by using a linear gauge or the like).

Signals from the contact start detecting means 105 and the contact start position detecting means 106 are input to a control means 107 including a CPU, ROM, RAM, A/D converter, various I/F, etc. The control means 107 performs various computation processings in accordance with a predetermined program based on various items of information, such as input signals and stored values, sending a drive signal to the vertical driving mechanism 104 to control the driving of the vertical driving mechanism 104, and sending a drive signal to an ultrasonic horn 102 to control the driving of the ultrasonic horn 102.

In this embodiment, the detection of contact with the electronic part 100 with the substrate 108 is effected as described above, and, at the same time, a mounting processing (bonding processing) is executed.

In the following, the control effected by the control means 107 of this embodiment will be illustrated with reference to the flowchart of FIG. 3.

In step (indicated by "S" in the drawings; the same applies hereinbelow) 1 in FIG. 3, the control means 107 sets HsO (contact detection start initial position; see FIG. 2) according to information previously stored.

Incidentally, from the transfer position A to the contact detection start initial position HsO, it is desirable for the lowering to be effected at a relatively high speed in order to make the tact time, etc. as short as possible, so that it is desirable for the contact detection start initial position HsO to be set at a position as close to the substrate 108 as possible; however, as stated above, there is a variation or the like in the distance between the electronic part 100 and the substrate 108 due to product variation, etc., so that, as shown in FIG. 2, the contact detection start initial position HsO is set at a position which makes it possible to reliably avoid inadvertent contact of the electronic part 100 with the substrate 108 and to sufficiently ensure the contact detection distance Ls to maintain the contact detection accuracy (a position relatively far from the substrate 108).

In step 2, the control means 107 moves the vertical driving mechanism 104 to a part passing position shown in FIG. 2 according to previously stored information, etc., causing the electronic part 100 to be suction-supported by the chip holding tool 101.

In step 3, the chip holding tool 101 and, by extension, the electronic part 100 suction-supported by the chip holding tool 101 is moved to the transfer position A shown in FIG. 2.

In step 4, the chip holding tool 101 is lowered from the transfer position A to the contact detection start initial position HsO at a relatively high speed. This step 4 constitutes an initial movement control means.

In step 5, when the chip holding tool 101 has been lowered to the contact detection start initial position HsO, the lowering speed is changed to a relatively low contact detection speed previously set. This step 5 constitutes a contact movement control means.

In step 6, a judgment is made as to whether the electronic part 100 suction-supported by the chip holding tool 101 has come into contact with the substrate 108 or not. This judgment can be made based, for example, on a change in an output signal from the contact start detecting means 105. When the judgment result in the step 6 is "YES", the procedure advances to step 7, and, when the judgment result is "NO", the step 6 is repeated until contact is detected.

In step 7, the lowering of the chip holding tool 101 is stopped.

In step 8, the current position in the height direction (the actual contact position) Hc of the chip holding tool 101 is detected and stored. The contact position Hc can be detected based on a detection signal from the contact start position detecting means 106.

In step 9, the next contact detection start position Hs1 is obtained. The next contact detection start position Hs1 can be obtained based on the actual contact position Hc detected and a pre-set contact detection distance Ls. For example, it can obtained from the equation: Hs1=Hc+Ls. And, in order that the obtained next contact detection start position Hs1 may be reflected in the next processing onwards, Hs1 is set to Hs0 (Hs0←Hs1). It should be noted that, in attaining both maintenance of detection accuracy and a reduction in tact time, it is desirable for the contact detection distance Ls to be set to as small a value as possible allowing maintenance of a desired contact detection accuracy. The step 9 constitutes a correction means.

In step 10, the driving of the ultrasonic horn 51 is controlled to effect ultrasonic bonding of the electronic part 100 and the substrate 108.

When, in step 11, the mounting processing in step 10 has been completed, the chip holding tool 101 is conveyed to the transfer position A.

In step 12, a judgment is made as to whether there is a stop command or not. If the judgment result is "YES", this flow is completed, and, when the judgment result is "NO", the procedure returns to step 2, where the mounting processing is repeated.

Thus, in this embodiment, the position where the electronic part 100 actually starts to come into contact with the substrate 108 (the contact position Hc) is detected, and, on the basis of the detection result, the contact detection start position in the next mounting processing is corrected, so that it is possible to correct the contact detection start position for each bonding processing, whereby it is possible to bring the contact detection start position Hc as close as possible to the substrate 108 while maintaining an optimum contact detection distance Ls. Thus, it is possible to minimize the tact time while maintaining a desired contact detection accuracy while reliably avoiding inadvertent contact of the electronic part 100 with the substrate 108, whereby it is possible, for example, to simultaneously achieve an improvement in the product quality and maintenance thereof and a reduction in the product cost.

Next, a second embodiment of the present invention will be described.

In relation to the second embodiment, the case in which the load detecting device disclosed in Japanese Patent Application Laid-Open No. 2001-105559 by the present applicant is utilized will be described more specifically.

Figure 4:
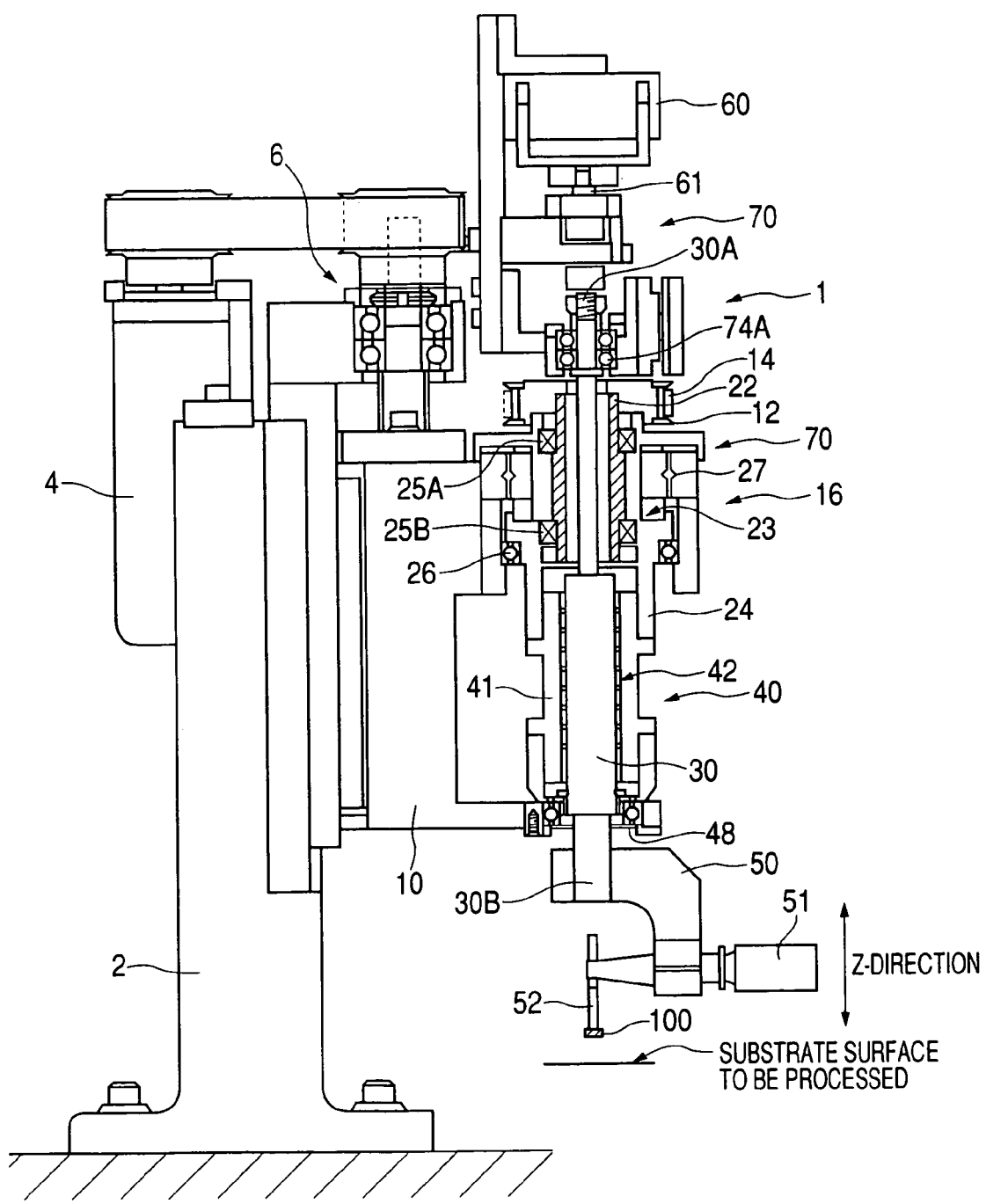
FIG. 4 is a front view of the mounting head of a mounting apparatus according to a second embodiment of the present invention.
Figure 5A:
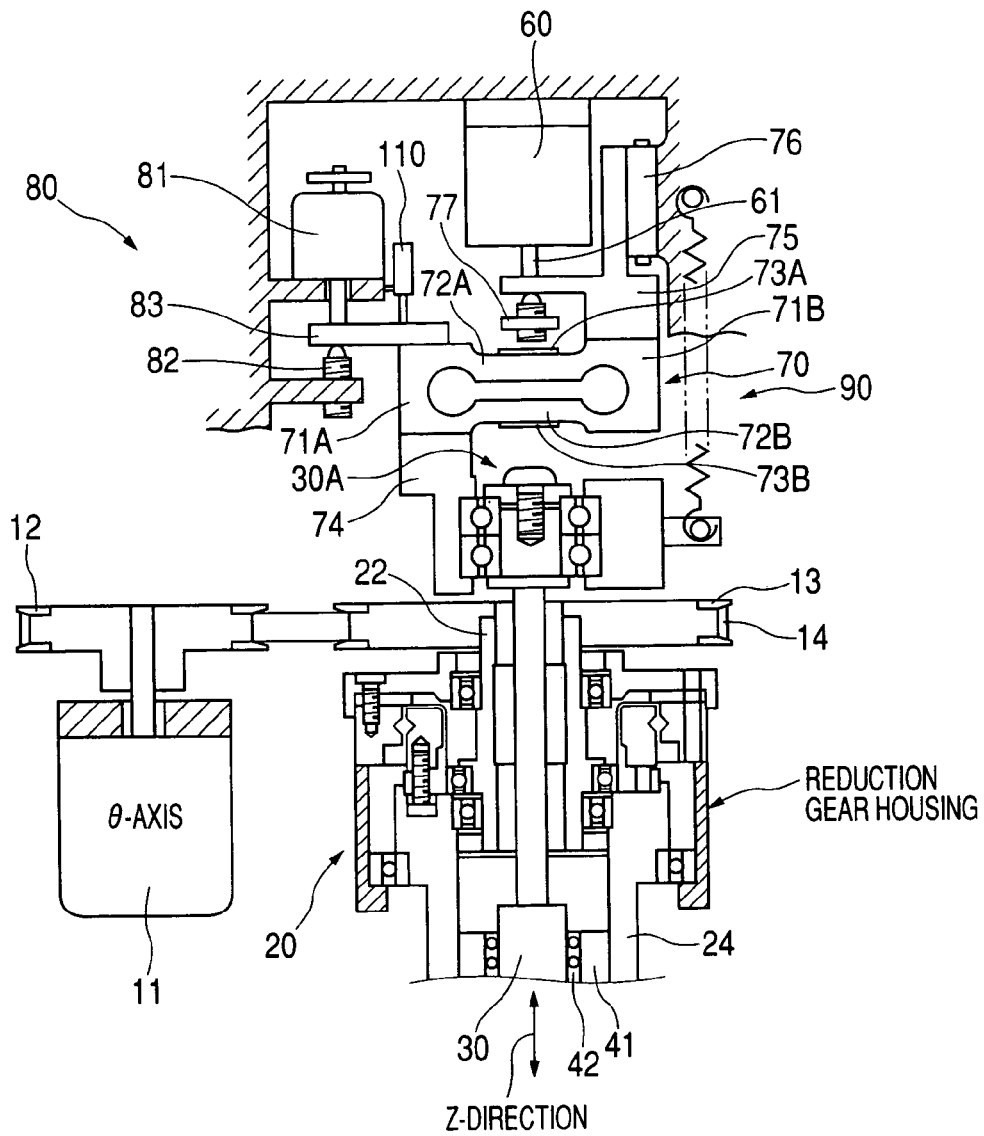
FIG. 5A is a partial side sectional view of a portion of the load detecting device, etc. of the mounting head of FIG. 4.
Figure 5B:
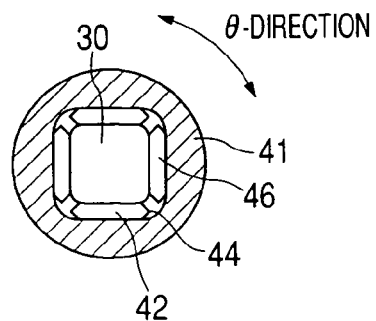
FIG. 5B is a sectional view of a θ-axis shaft and a sleeve.

FIGS. 4, 5A, and 5B show the mounting head portion of a mounting apparatus (processing apparatus) according to the second embodiment of the present invention.

First, the general construction of the mounting head portion of the part mounting apparatus of this embodiment will be described.

Referring to FIG. 4, a head base 2 supporting a mounting head 1 is placed on the base of this part mounting apparatus together with the substrate holding means 109 for supporting the substrate 108 at a predetermined position (see FIG. 1; it is not shown in FIG. 4), and is constructed so as to be capable of freely moving in X- and Y-planes substantially parallel to the surface to be processed of the substrate 108 on which the electronic part 100 is to be mounted through an X-Y driving mechanism (not shown).

The mounting head 1 is supported by the head base 2 through the intermediation of a Z-axis driving mechanism composed of a Z-axis driving motor 4 and a Z-axis ball screw mechanism 6. The Z-axis ball screw mechanism 6 is rotated by the Z-axis driving motor 4 through a pulley and a belt, and a vertically movable block 10 can be moved vertically (moved in the Z-direction substantially perpendicular to the surface to be processed of the substrate) for the purpose of positional adjustment with respect to the surface to be processed of the substrate, etc.

The vertically movable block 10 is equipped with a θ rotation mechanism 20. This θ rotation mechanism 20 is a mechanism for rotating in a θ-direction a θ-axis shaft 30 to which a chip holding tool 52 for holding the electronic part 100 is mounted. Here, the θ-direction is a direction in which the θ-axis shaft 30 is rotated around a rotation center axis (see FIG. 5B).

Regarding this θ rotation mechanism 20, fixed to the vertically movable block 10 is a θ driving motor 11. As shown in FIG. 5A, an output pulley 12 is fixed to the output rotation shaft of the θ driving motor, and the rotation of the output pulley 12 is transmitted to an input pulley 13 of the θ rotation mechanism 20 through a belt 14. In FIG. 5A, the shaded portion is supported by the vertically movable block 10.

Below the input pulley 13, there is provided a coaxial reduction gear 16 (e.g., a wave decelerating device with the trade name: "Harmonic Drive") for decelerating the rotation of the input pulley 13 and transmitting it to θ-axis shaft 30. The input pulley 13 is coaxially connected to an input shaft 22 of the reduction gear 16. The input shaft 22 is rotatably supported, through the intermediation of bearings 25A and 25B, with respect to the housing of the reduction gear 16 supported by the vertically movable block 10.

The rotation of the input shaft 22 is decelerated to a predetermined level by a wave reduction gear device 23 coaxially arranged in the outer periphery of the input shaft 22, and is transmitted to an output shaft member 24 arranged coaxially therewith on the outer side thereof.

Here, the output shaft member 24 is rotatably supported with respect to the housing of the reduction gear 16 by means of bearings 26 and 27, and is capable of rotating independently of the housing and, by extension, of the head base 2 supporting it and the vertically movable block 10.

The θ-axis shaft 30 is rotation-connected to the output shaft member 24 through the intermediation of a rotary reciprocating movement transmission mechanism 40. Thus, the rotation of the output shaft member 24 outputting the rotation of the θ driving motor 11, input through the input pulley 13, after decelerating it to a predetermined level through the reduction gear 16, is transmitted to the θ-axis shaft 30 through the rotary reciprocating movement transmission mechanism 40.

That is, the rotary reciprocating movement transmission mechanism 40 has a polygonal section substantially perpendicular to the axis of the θ-axis shaft 30 (see FIG. 5B), and, further, includes a sleeve 41 with a central opening having a configuration corresponding to the above polygonal configuration and allowing insertion and holding of the θ-axis shaft 30 so as to allow its reciprocation in the Z-direction through the intermediation of a bearing 42 (including a needle bearing 46 held by a retainer 44; see FIGS. 4 and 5B), and the sleeve 41 and the output shaft member 24 are rotation-connected, whereby the θ-axis shaft 30 inserted and held in the sleeve 41 is rotated by a dragging action due to the polygonal configuration. The sleeve 41 is rotatably supported with respect to the vertically movable block 10 through the intermediation of a bearing 48.

Incidentally, the rotational center portions of the input pulley 13, the input shaft 22, and the output shaft member 24 are hollow, and the θ-axis shaft 30 is passed therethrough, the upper end portion 30A of the θ-axis shaft 30 protruding upwardly beyond the input pulley 13 as shown in FIGS. 4 and 5A.

On the other hand, the θ-axis shaft 30 extends downwardly in FIG. 4 past the rotary reciprocating movement transmission mechanism 40 for connection with the output shaft member 24, and an ultrasonic motor 51 is mounted to the lower end portion 30B thereof through the intermediation of an ultrasonic motor bracket 50; mounted to the ultrasonic motor 51 is the chip holding tool 52 holding the electronic part 100 and acting on the surface to be processed.

The upper end portion 30A of the θ-axis shaft 30 is connected to a reciprocating movement power source 60 (a pressurizing actuator or the like, including, for example, a voice coil motor, an air cylinder, an electromagnetic actuator, etc.) for causing the θ-axis shaft 30 and, by extension, the chip holding tool 52 to make a reciprocating movement (Z-axis movement) through pressure control, through the intermediation of a load detecting device 70, etc. according to this embodiment.

That is, in this embodiment, when, for example, pressing the electronic part 100 held by the chip holding tool 52 against the surface to be processed of the substrate 108, the reciprocating movement power source 60 is driven downwards in FIG. 4, whereby the reciprocating movement driving force is applied to the θ-axis shaft 30, and the θ-axis shaft 30 can move downwards (in the Z-axis direction) in FIG. 4 through the rotary reciprocating movement transmission mechanism 40 in which the θ-axis shaft 30 is inserted and held so as to be capable of reciprocating vertically.

The reciprocating movement power source 60 functions as the pressurizing means of the present invention, and its driving amount is controlled such that a predetermined pressurizing force control can be achieved in accordance with control signals (in conformity to a mounting profiled in which, for example, the pressurizing force, pressurizing timing, pressurizing period, pressurizing time change, etc. are set) from a control means 107 (see FIG. 1; not shown in FIGS. 4, 5A and 5B). This control may be a feed forward control (open control) and, at the same time, a feedback control (closed control) based, for example, on the pressurizing force detection result of the load detecting device 70.

As described above, in this embodiment, due to the provision of the rotary reciprocating movement transmission mechanism 40, the rotation from the θ drive motor 11 can be transmitted to the θ-axis shaft 30 through the input pulley 13, the reduction gear 16, and the output shaft member 24 and, at the same time, a driving force (a reciprocating force) in the vertical direction (the Z-direction) from the reciprocating movement power source 60, input by another route, can be transmitted to the θ-axis shaft 30.

Next, the load detecting device 70 of this embodiment will be described.

The load detecting device 70 of this embodiment functions as a contact start detecting means (or a pressurizing force detecting means) according to the present invention, and is provided between the upper end portion 30A of the θ-axis shaft 30 and the reciprocating movement power source 60 as shown in FIGS. 4 and 5A.

(Pressurizing Force Detection Mechanism)

As shown in FIG. 5A, the load detecting device 70 includes a rectangular straining member 71 formed by integrally connecting longitudinal elements 71A and 71B and lateral elements 72A and 72B. And, strain gauges 73A and 73B serving as strain detecting means for detecting strain are mounted to the lateral elements 72A and 72B of the straining member 71. Based on detection signals from these strain gauges 73A and 73B, it is possible to detect the force applied to the θ-axis shaft 30, that is, the actual pressurizing force applied between the electronic part 100 and the substrate 108.

More specifically, mounted to the lower surface of the longitudinal element 71A of the straining member 71 is a shaft support member 74 whose one end portion is fixed to this lower surface and whose other end portion extends laterally toward the center axis of the θ-axis shaft 30 to rotatably support the upper end portion 30A of the θ-axis shaft 30 through the intermediation of a bearing 74A, etc. and, at the same time, support it such that relative movement in the Z-direction of the θ-axis shaft 30 can be regulated.

And, mounted to the upper surface of the longitudinal element 71B is a reciprocating movement power source side member 75 whose one end portion is fixed to this upper surface and whose other end portion extends laterally toward the center axis of the θ-axis shaft 30 to receive a pressurizing force from an output shaft 61 of the reciprocating movement power source 60.

Thus, when the reciprocating movement power source 60 is driven downwards in FIGS. 4 and 5A, its force is transmitted to the reciprocating movement power source side member 75, and transmitted to the longitudinal element 71B connected to the reciprocating movement power source side member 75, and, further, transmitted to the longitudinal element 71A through the lateral elements 72A and 72B to be transmitted to the θ-axis shaft 30 supported by the longitudinal element 71A through the intermediation of the shaft support member 74. With this force thus transmitted, the electronic part 100 mounted to the lower end side of the θ-axis shaft 30 is pressurized against the substrate 108 with a predetermined pressurizing force.

In this case, the reciprocating movement power source side member 75 connected to the output shaft 61 of the reciprocating movement power source 60 and, by extension, the longitudinal element 71B, are inclined to be displaced downwards in FIG. 5A; however, the longitudinal element 71A connected to the θ-axis shaft 30 is inclined to resist the displacement due to the reaction force from the electronic part 100, so that there is generated, in the lateral elements 72A and 72B provided between the longitudinal element 71A and the longitudinal element 71B, a strain corresponding to the pressurizing force. Thus, by detecting this strain by the strain gauges 73A and 73B, it is possible to accurately detect the actual pressurizing force exerted between the electronic part 100 and the substrate 108.

In order to make it possible to accurately detect the pressurizing force generated in the axial direction of the θ-axis shaft 30 and, by extension, to prevent the straining member 71 (and, by extension, the load detecting device 70) from being rotated by the couple of forces generated at the time of application of the pressurizing force, it is possible to support the reciprocating movement power source side member 75 and, by extension, the longitudinal element 71B (and, further, the load detecting device 70) by a linear guide 76 adapted to perform guiding so as to effect movement substantially parallel to the axial direction of the θ-axis shaft 30.

Incidentally, this linear guide 76 regulates movements of the reciprocating movement power source side member 75 other than the movement thereof in the direction substantially parallel to the axial direction of the θ-axis shaft 30 (the Z-direction), so that, synergistically with the action of the bearing 74A supporting the θ-axis shaft 30 so as to allow it to rotate in the θ-direction, it is possible to prevent the load detecting device 70 from being dragged in the θ-direction by the rotation in the θ-direction of the θ-axis shaft 30. In FIG. 5A, reference numeral 90 indicates a component functioning as a spring (a weight balance spring) for supporting a member on the downstream side with respect to pressurization on the vertically movable block 10 with a predetermined elastic force in order to keep the weight of that member, which is on the downstream side of the lateral element 72B in the pressurization transmission route with respect to the pressurizing direction, from affecting the pressurizing force detection. The spring 90 is not restricted to the one shown; any type of spring will do as long as it is capable of providing the same function; for example, it is also possible to arrange a plate spring horizontally in FIG. 5A, and fix one end of the plate spring to the shaft support member 74, fixing the other end to the vertically movable block 10. Further, the spring 90 may be omitted.

Figure 3:
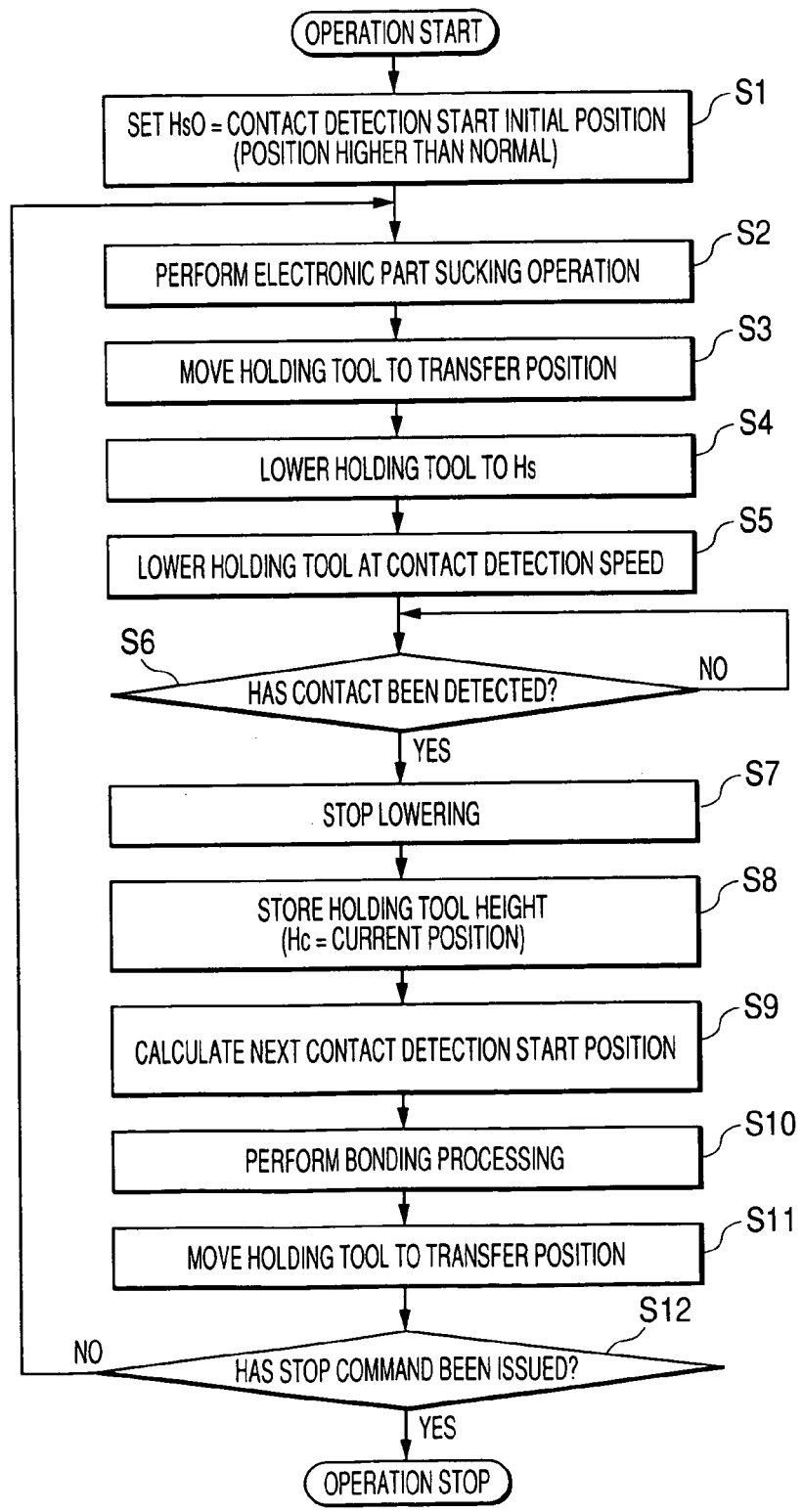
FIG. 3 is a flowchart illustrating the mounting procedures in the first embodiment.

In the mounting apparatus, constructed as described above, the same procedures as those shown in the flowchart of FIG. 3, illustrated with reference to the first embodiment, are executed, performing bonding between the electronic part 1 and the substrate 108.

Here, the procedures conducted in this embodiment will be described in detail with reference to the flowchart of FIG. 3.

In step 1, the control means 107 sets HsO (the contact detection start initial position; see FIG. 2) in accordance with information previously stored.

In step 2, the electronic part 100 to be mounted is held through vacuum suction by the chip holding tool 52 in the parts passing portion shown in FIG. 2.

In step 3, the X-Y driving mechanism is operated in accordance with the control by the control means 107 to move the mounting head 1 to the transfer position A above the substrate 108. Similarly, in accordance with the control by the control means 107, the θ rotation mechanism 20 is operated to orient the electronic part 100 in the correct mounting direction with respect to the substrate 108.

In this state, both the electronic part 100 and the substrate 108 are imaged by, for example, an imaging device, and the obtained image data is subjected to image processing to calculate the positional deviation between the electronic part 100 and the substrate 108. Based on the positional deviation data obtained, the X-Y driving mechanism and the θ rotation mechanism 20 are operated again to perform positional correction on the electronic part 100 with respect to the substrate 108.

By the above process, the electronic part 100 is set at the correct mounting position with respect to the substrate 108.

Figure 9:
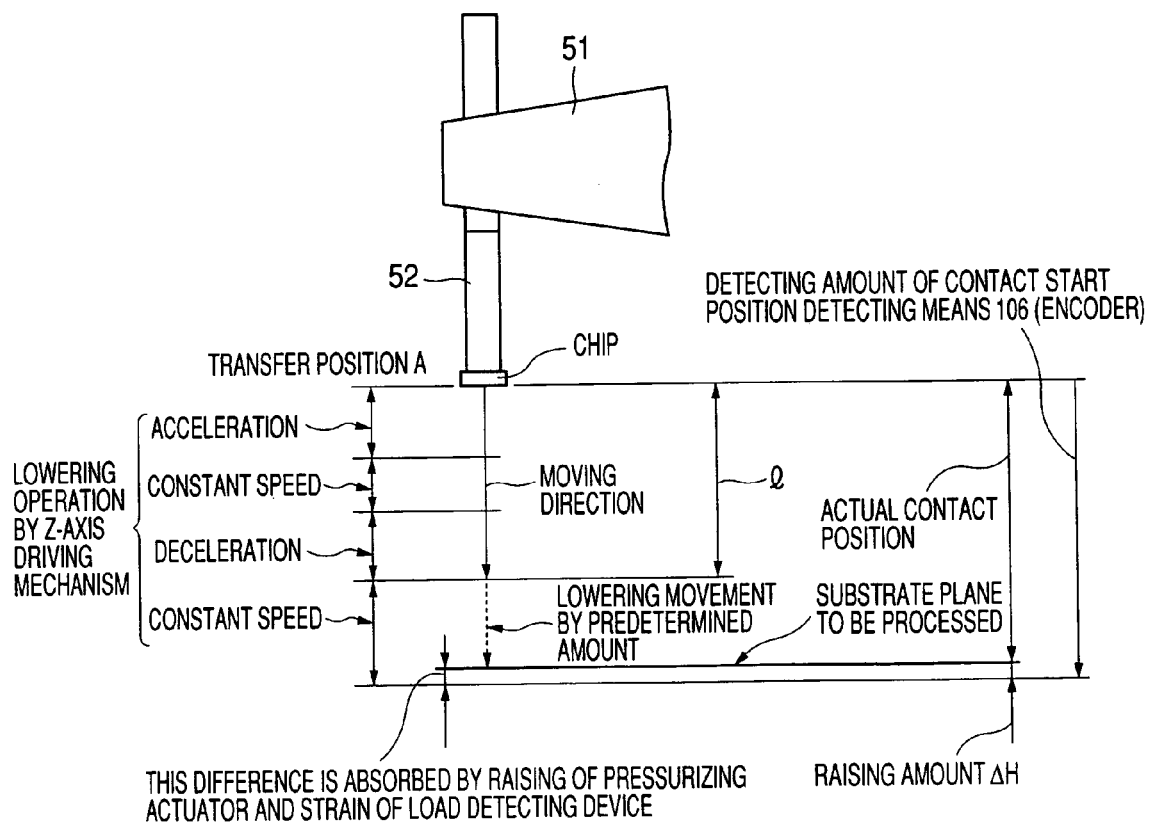
FIG. 9 is a diagram showing an example of how lowering control is effected on a chip holding tool according to the present invention.

In step 4, the Z-axis driving mechanism, composed of the Z-axis drive motor 4 and the Z-axis ball screw mechanism 6 and allowing position control, is operated to lower the electronic part 100 to the contact detection start initial position HsO. To achieve, for example, both promotion of the processing efficiency and suppression of the inertial force, it is desirable for this lowering operation to be controlled such that the lowering speed is variable as shown in FIG. 9; however, this naturally allows variations as needed, and the lowering may, for example, be effected at even speed.

During this lowering operation, the inertial force generated from the lowering operation may cause the θ-axis shaft 30 and the load detecting device 70 to float, or act on the lateral elements 72A and 72B, thereby adversely affecting the pressurizing force detection (the contact point detection) by the strain gauges 73A and 73B. In view of this, the reciprocating movement drive source 60 is driven previously downwards in FIG. 4 with a predetermined initial pressurizing force, and, with the driving force, the reciprocating movement power source side member 75 is urged through pressurization against the lock member 77, whereby the reciprocating movement power source side member 75 and, by extension, the longitudinal element 71B are locked at a predetermined position in the Z-direction with respect to the vertically movable block 10. At the same time, as shown in FIG. 5A, a lock member 83 and, by extension, the longitudinal element 71A fixed thereto are locked at a predetermined position in the Z-direction with respect to the vertically movable block 10 (a position where no strain is generated in the lateral elements 72A and 72B in relation to the lock position of the lock member 77). It is possible for the lock positions (heights) of the lock member 77 and the lock mechanism 80 to be made adjustable through screwing-in amount adjustment, shim adjustment, etc.

Due to this arrangement, even if an inertial force is generated during the lowering operation, it is possible to reliably prevent the θ-axis shaft 30 and the load detecting device 70 from floating, thereby making it possible to restrain generation of strain in the lateral elements 72A and 72B and to suppress, as much as possible, the influence of the inertial force on the load detection of the load detecting device 70.

The effect of the locking by the lock member 77 is not restricted to the elimination of the influence of the inertial force, etc. As described below, the reciprocating movement power source 60 for pressurizing force control is driven previously at a predetermined initial pressurizing force, with the output shaft 61 and the reciprocating movement power source support member 75 abutting the lock member 77 prior to the contact start of the chip and the substrate, whereby the lock contributes to making it possible to effect pressurization control through position control of the Z-axis drive mechanism from the contact start of the chip and the substrate to the attainment of the predetermined initial pressurizing force.

In step 5, as shown in FIG. 9, the electronic part 100 is lowered at a relatively low, even speed by a predetermined amount to bring it gradually closer to the substrate 108 while maintaining the lock state by the lock member 77 and the lock mechanism 80. When this lowering by a predetermined amount at even speed is started, the adverse effect of the inertial force is substantially eliminated, so that, while maintaining the lock state by the lock member 77, a solenoid 81 of the lock mechanism 80 is released to cancel the lock by the lock mechanism 80. Here, the lock member 77 corresponds to the lock means.

In step 6, a judgment is made as to whether the electronic part 100 suction-supported by the chip holding tool 52 has come into contact with the substrate 108 or not. This judgment can be made based, for example, on a change in an output signal from the load detecting device 70 functioning as a contact start detecting means 105. When the judgment result in the step 6 is "YES", the procedure advances to step 7, and, when the judgment result is "NO", the step 6 is repeated until contact is detected.

In this embodiment, the contact start time is detected with high accuracy as follows based on the output of the load detecting device 70.

That is, in this embodiment, there is arranged the lock member 77 supporting the reciprocating movement power source side member 75, connected to the output shaft 61 of the reciprocating movement drive source 60, from below (in a direction opposite to gravity) in FIG. 5A at a predetermined position in the Z-direction.

This lock member 77 is supported by the vertically movable block 10, and with the lock member 77, even if the reciprocating movement drive source 60 is driven downwards in FIG. 4, the output shaft 61 and the reciprocating movement power source side member 75 are locked at a predetermined position in the Z-direction with respect to the vertically movable block 10.

Figure 6A:
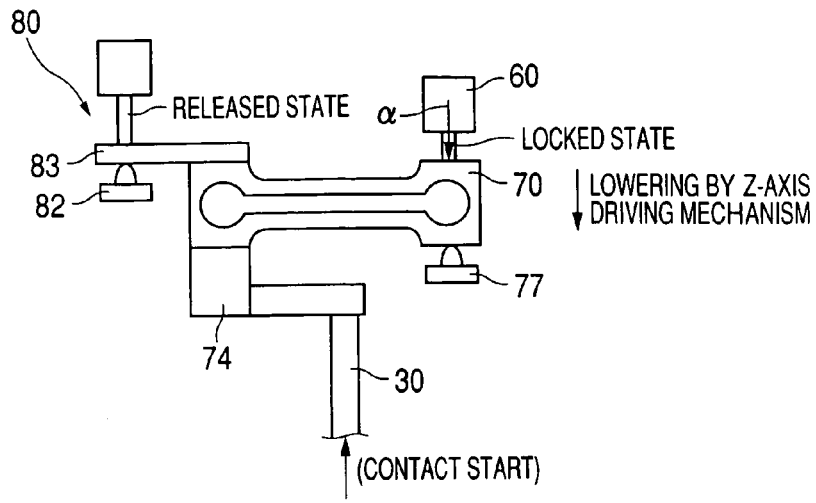
Figure 7:
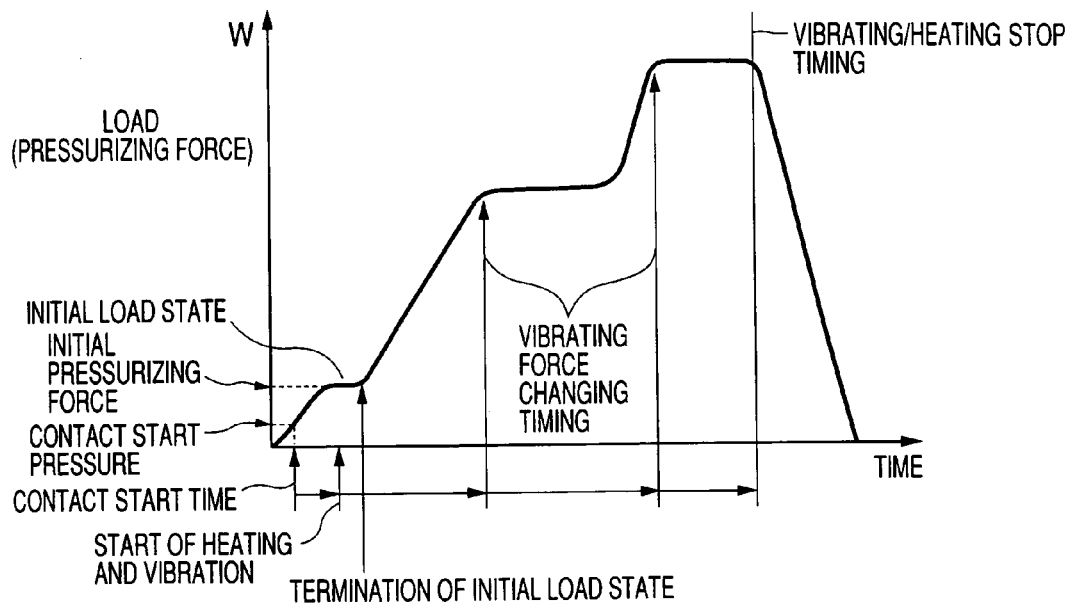
FIG. 7 is a diagram showing an example of a mounting profile (pressurizing profile, vibrating profile, heating profile) according to the second embodiment.
Figure 8A:
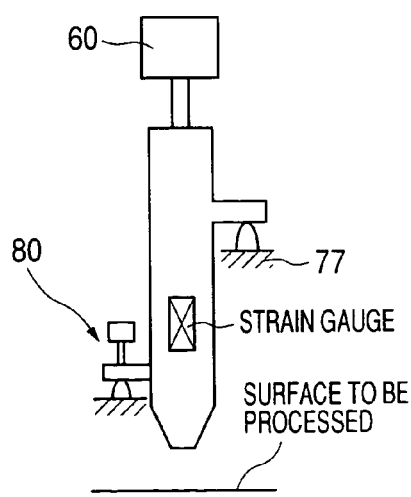
FIGS. 8A and 8B are diagrams illustrating other construction examples of the load detecting device and, by extension, the output member.
Figure 8B:
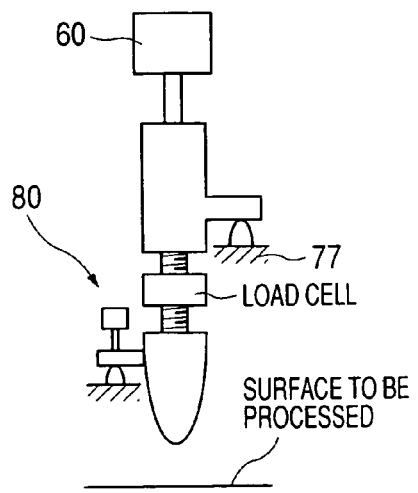

Thus, by the lowering of the Z-axis drive mechanism at even speed in step 5, the contact of the electronic part 100 and the substrate 108 is started; upon the contact start, there is generated a pressurizing force between the electronic part 100 and the substrate 108 as shown in FIG. 6A; although the lock mechanism 80 is in the released state, the lock of the output shaft 61 of the reciprocating movement power source 60 is maintained by the lock member 77, so that the above-mentioned pressurizing force strains the lateral elements 72A and 72B as the Z-axis drive mechanism is moved, whereby, as shown in FIG. 7, it is possible to gradually increase the pressure with a relatively gentle gradient.

Figure 6B:
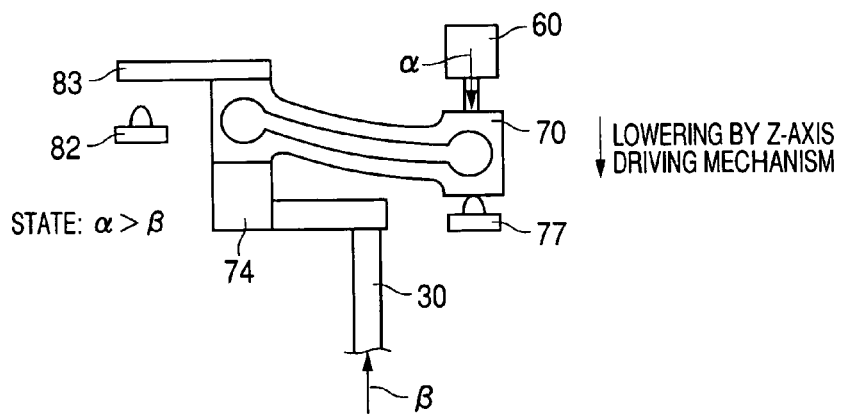

As shown in FIG. 6B, while this pressurizing force (reaction force) β is smaller than the output (pressurizing force) α of the reciprocating movement power source 60, the shaft support member 74 is raised through the θ-axis shaft 30, and the lock member 83 mounted to the upper surface of the longitudinal element 71A of the strainer 71 is separated from the stopper 82 of the lock mechanism 80, thereby generating strain in the lateral elements 72A and 72B.

Thus, with the load detecting device 70 of this embodiment, which detects strain in the lateral elements 72A and 72B to detect the pressurizing force, it is possible to detect with high accuracy a minute change in pressurizing force accompanying the contact start.

That is, in this embodiment, it is possible to smoothly start the contact of the electronic part 100 and the substrate 108 with a minute pressurizing force, and it is possible to increase the pressurizing force relatively gently, so that it is possible to reliably prevent damage, etc. upon inadvertent collision of the electronic part 100 and the substrate 108, and it is possible to detect with high accuracy the contact start based on the pressure detection result obtained by the load detecting device 70. In detecting the contact start, it is possible to regard as the contact start point, for example, the point in time when the pressurizing force detected by the load detecting device 70 has become larger than a predetermined contact start pressure (inclusive of the case in which the pressure is zero) or the point in time when it has undergone a predetermined change (when the curvature in the change in pressurizing force has become larger than a predetermined level). However, the pressurization characteristic from the contact start to the completion of the initial load state described below is related to the predetermined initial pressurizing force, etc. imparted from the reciprocating movement power source 60, so that, apart from the gentle increase in pressurizing force, it is possible to impart an arbitrary pressurizing force increase characteristic (pressure increasing speed) by adjusting the moving speed of the Z-axis drive mechanism.

Subsequently, in step 7, the movement of the Z-axis drive mechanism is stopped, and the lowering of the chip holding tool 52 is stopped.

In step 8, the current position in the height direction (the actual contact position) Hc of the chip holding tool 52 is detected and stored. The contact position Hc can be detected based on a detection signal from the contact start position detecting means 106 described with reference to the first embodiment. More specifically, the contact start position detecting means 106 includes an encoder or the like operationally connected with the movement in the Z-direction of the Z-axis drive mechanism, making it possible to detect, based on the output signal of the encoder, the amount by which the Z-axis drive mechanism descends from the transfer position A. Then, based on the rotating amount of the encoder at the contact start time detected in step 6 (and, by extension, the amount by which the Z-axis drive mechanism is lowered from the transfer position A), the contact position Hc is detected.

In step 9, as in the first embodiment, the next contact detection start position Hs1 is obtained. The next contact detection start position Hs1 can be obtained based on the actual contact position Hc detected and a pre-set contact detection distance Ls. For example, it can obtained from the equation: Hs1=Hc+Ls. And, in order that the obtained next contact detection start position Hs1 may be reflected in the next processing onwards, Hs1 is set to Hs0 (Hs0←Hs1). It should be noted that, in attaining both maintenance of detection accuracy and a reduction in tact time, it is desirable for the contact detection distance Ls to be set to as small a value as possible allowing maintenance of a desired contact detection accuracy.

In step 10, the driving of the ultrasonic horn 51 is controlled to effect ultrasonic bonding of the electronic part 100 and the substrate 108.

More specifically, the following process is conducted.

Figure 6C:
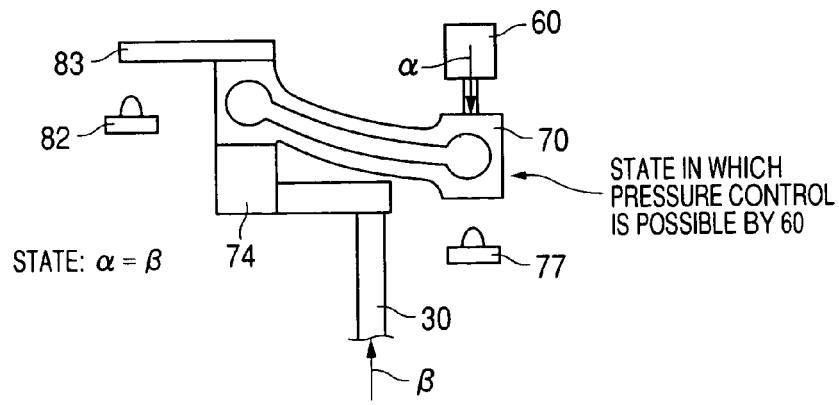

As, after the detection of the contact start point, the electronic part 100 is further lowered by the Z-axis drive mechanism, the pressurizing force (reaction force) β generated between the electronic part 100 and the substrate 108 is gradually increased to increase the strain of the lateral elements 72A and 72B; however, when the pressurizing force (reaction force) β between the chip and the substrate reaches a predetermined initial pressurizing force (that is, the pressurizing force α) for the lock member 77 of the output shaft 61 of the reciprocating movement power source 60, the actual the pressurizing force (reaction force) β between the electronic part 100 and the substrate 108 and the predetermined initial pressurizing force a for the lock member 77 are balance with each other as shown in FIG. 6C, with the result that it is possible to move the output shaft 61 of the reciprocating movement power source 60 upwardly with respect to the lock member 77 and, by extension, the vertically movable block 10 as seen in FIG. 6C. At this time, the output shaft 61 and the lock member 77 are spaced apart from each other, and the positional regulation by the lock member 77 is canceled.

That is, as shown in FIG. 7, even when the lowering of the electronic part 100 proceeds, there is generated a constant-pressure period (initial load state) in which there is no increase in pressurizing force.

It should be noted that, of the mounting profile shown in FIG. 7, the pressurizing profile (pressurizing characteristic) from the contact start to the completion of the initial load is related to the moving speed of the Z-axis drive mechanism, the predetermined initial pressurizing force imparted from the reciprocating movement power source 60, etc., so that, by adjusting the moving speed of the Z-axis drive mechanism, the initial pressurizing force of the reciprocating movement power source 60, etc. it is possible to set an arbitrary pressurization profile (pressurization characteristic). Further, in this embodiment, the actual change in pressurizing force from the contact start to the completion of the initial load state can be detected with high accuracy and monitored through the load detecting device 70. Thus, by adjusting the moving speed, the predetermined initial pressurizing force, etc. in a feed-forward-control-like fashion based on the monitoring result, or by feedback-controlling the moving speed, the predetermined initial pressurizing force of the reciprocating movement power source 60, etc. based on the pressurizing force detection result of the load detecting device 70, it is possible to control, in a desired manner, the pressurization profile from the contact start to the completion of the initial load state.

When the constant-pressure period has reached a predetermined length, pressurization control according to the pressurization profile by the reciprocating movement power source 60 (the profile of the mounting profile of FIG. 7 from the completion of the initial load state onward) is executed.

During this pressurization control, it is possible to feedback-control the driving amount (pressurizing force) of the reciprocating movement power source 60 so as to attain a predetermined pressurization profile based on the pressurizing force detection result obtained by the load detecting device 70, whereby it is possible to trace the pressurization profile more accurately as compared with the case in which feed-forward control is conducted. However, it is naturally also possible to monitor the pressurizing force detected by the load detecting device 70, without performing any feedback control, and use it for adjustment of the feed-forward-control value, or use it as information for judging the pressurizing state.

In this way, it is possible to achieve a pressurization control allowing tracing of the pressurization profile with high accuracy using the detection result obtained by the load detecting device 70 of this embodiment.

With the electronic part 100 being pressed against the substrate 108 and heated in accordance with the mounting profile in which the vibration amount and heating amount are determined to predetermined levels (see FIG. 7) (that is, while controlling the heating timing and heating amount or the heating timing and vibration amount), the ultrasonic horn 51 is vibrated, whereby the conductor on the electronic part 100 side is fused to the conductor on the substrate 108 side to thereby complete the operation.

When, in step 11, the mounting processing in step 10 has been completed, the chip holding tool 52 is conveyed to the transfer position A.

In step 12, a judgment is made by the control means 107 as to whether there is a stop command or not. If the judgment result is "YES", this flow is completed, and, when the judgment result is "NO", the procedure returns to step 2, where the mounting processing is repeated.

In this way, in the second embodiment, the position at which the electronic part 100 actually starts to come into contact with the substrate 108 (the contact position Hc) is detected with high accuracy by using the load detecting device 70, and, based on the detection result, the contact detection start position for the next mounting processing is corrected, so that it is possible to correct the contact detection start position with high accuracy for each mounting processing, whereby it is possible to bring the contact detection start position Hc as close as possible to the substrate 108 while maintaining an optimum contact detection distance Ls. Thus, it is possible to minimize the tact time while maintaining a desired contact detection accuracy while reliably avoiding inadvertent contact of the electronic part 100 with the substrate 108, whereby it is possible to achieve both maintenance/improvement of the product quality and a reduction in the product cost.

Next, a third embodiment of the present invention will be described.

In the third embodiment, a construction basically the same as that of the second embodiment is provided, and a similar processing is conducted; only, as compared with the second embodiment, it is possible to perform the detection of the contact position Hc in step 8 of the flowchart of FIG. 3 with still higher accuracy. Here, solely what is different from the second embodiment will be described.

In the third embodiment also, the actual contact position Hc is detected; for still higher detection accuracy, the third embodiment employs, in addition to the contact start position detecting means 106, a linear gauge 110.

That is, in the third embodiment, as in the second embodiment, the contact start is detected by utilizing the detection result obtained by the load detecting device 70; as described with reference to FIG. 6B, when utilizing the load detecting device 70, the θ-axis shaft 30 is raised until the contact start is detected, which means this raising amount cannot be taken into account solely by obtaining the contact position Hc based on the rotating amount of the encoder detected by the contact start position detecting means 106 (and, by extension, the amount by which the Z-axis drive mechanism is lowered from the transfer position A) (see FIG. 9).

Thus, in the third embodiment, taking into account the above raising amount, there is provided the linear gauge 110 in order to obtain the actual contact position Hc with still higher accuracy.

As shown in FIG. 5A, the linear gauge 110 is arranged so that the raising amount of the straining member 71 and, by extension, of the θ-axis shaft 30 can be detected. The output signal of the linear gauge 110 is input to the control means 107 (not shown). The θ-axis shaft 30 constitutes a part of the output member. When the straining member 71 is provided as in this embodiment, the straining member 71 also constitutes a part of the output member.

And, in the third embodiment, regarding steps 1 through 7 of the flowchart of FIG. 3, the same procedures as those of the second embodiment are conducted, whereas, in step 8, the contact position Hc is detected based on the detection signal from the contact start position detecting means 106 and the detection signal from the linear gauge 110. More specifically, by subtracting the raising amount ΔH obtained from the detection signal of the linear gauge 110 from the contact position Hc obtained from the output signal of the encoder of the contact start position detecting means 106, the actual contact position is detected with still higher accuracy. And, "Hc−ΔH" is set as the contact position Hc (Hc←Hc−ΔH). Here, the linear gauge 110 corresponds to the raising amount detecting means, and the correction of the contact position Hc, conducted in step 8, corresponds to the contact start position correcting means.

Subsequently, in step 9, as in the second embodiment, the next contact detection start position Hs1 is obtained. The next contact detection start position Hs1 can be obtained based on the contact position Hc (=Hc−ΔH) set in step 8 and a pre-set contact detection distance Ls. For example, it can be obtained from the equation: Hs1=Hc+Ls. And, in order that the next contact detection start position Hs1 may be reflected in the procedures from the next processing onward, Hs1 is set to Hs0 (Hs0←Hs1).

Thereafter, as in the second embodiment, the procedures of steps 10 through 12 are executed.

In this way, according to the third embodiment, when detecting the contact start by utilizing the detection result obtained by the load detecting device 70, the amount by which the θ-axis shaft 30 and, by extension, the electronic part 100 are raised upon contact start is taken into account, and the actual contact position Hc is detected, so that it is possible to obtain the actual contact position Hc with still higher accuracy. Thus, according to the third embodiment, the contact detection start position for the next mounting processing can be corrected with still higher accuracy, so that it is possible to correct the contact detection start position with high accuracy for each mounting processing, whereby it is possible to bring the contact detection start position Hc as close as possible to the substrate 108 while ensuring the contact detection distance Ls more accurately. Thus, it is possible to minimize the tact time while maintaining the contact detection accuracy at a still higher level while reliably avoiding inadvertent contact of the electronic part 100 with the substrate 108, whereby it is possible to achieve, at a still higher level, both maintenance/improvement of the product quality and a reduction in the product, etc.

Incidentally, as the method of bonding the electronic part (chip) to the substrate in the mounting apparatus described with reference to the above embodiments, it is also possible to adopt a system in which adhesive is applied to the bonding surface of either the electronic part (chip) or the substrate (or both of them) and in which the adhesive is cured while pressing the chip against the substrate in accordance with the mounting profile, thereby bonding the chip to the substrate.

Further, while in the above-described embodiments the electronic part and the substrate come into contact with each other in the gravitational direction, they can naturally also come into contact with each other in a direction other than the gravitational direction, for example, the horizontal direction. In this case, the adverse effect of the gravitational force on the load detection is eliminated or lessened, so that, it is possible to reduce in size or omit the spring 80, etc. in the second and third embodiments.

It should be noted that the present invention is not restricted to an apparatus for mounting a chip on a substrate; it is also applicable to any processing apparatus in which some processing is performed on a member to be processed while detecting a pressurizing force.

Further, when there is no need for the θ-correction, etc., it is possible to omit the various devices for θ-correction, such as the θ-rotation mechanism 20 and the rotary reciprocating movement transmission mechanism 40. Further, while in the above embodiments the movement for the positioning, etc. in the X-, Y-, and Z-directions is effected on the mounting head side, it is also possible to adopt a construction in which the substrate side, that is, the substrate stage (the base supporting the substrate constituting the object of processing), is moved in the X-, Y-, and Z-directions or in a part thereof with respect to the mounting head.

And, it goes without saying that the layout of the elements, devices, mechanisms, members, etc. of the apparatus of the above-described embodiment is not restricted to the one described above but allows modification as appropriate. For example, it is possible to adopt the layouts as shown in FIGS. 6A, 6B, and 6C.

As described above, according to the present invention, the position where the mounting part actually starts to come into contact with the mounting target part is detected, and, based on the detection result, the contact detection start position and, by extension, the initial moving amount for the next mounting processing are corrected, so that it is possible to correct the contact detection start position with high accuracy for each mounting processing, whereby it is possible to minimize the tact time while maintaining a desired contact detection accuracy while reliably avoiding inadvertent contact of the mounting part with the mounting target part, thereby making it possible to achieve both maintenance/improvement of the product quality and a reduction in the product cost.

The invention claimed is:

1. A mounting apparatus comprising:
   a mounting part holding means for holding a mounting part;
   a mounting target part holding means for holding a mounting target part;
   a control means for moving one of the mounting part holding means and the mounting target part holding means to bring the mounting part held by the mounting part holding means and the mounting target part held by the mounting target holding means into contact with each other in a predetermined fashion for a predetermined processing;
   a contact start detecting means for detecting start of contact between the mounting part and the mounting target part; and
   a contact start position detecting means for detecting a contact start position where the start of contact between the mounting part and the mounting target part is detected by the contact start detecting means, wherein the control means comprises:
an initial movement control means for moving the one of the means to be moved from a predetermined initial position toward the other means by a predetermined initial moving amount;
a contact movement control means for moving, after movement by the initial movement means by the predetermined initial moving amount, the one of the means to be moved toward the other means in a manner different from the movement by the initial movement means, bringing the mounting part into contact with the mounting target part; and
a correction means for correcting, each time the contact start position is detected by the contact start position detecting means, one of the predetermined initial moving amount and a predetermined initial moving amount that is obtained after correction by the correction means based on the contact start position detected.

2. A mounting apparatus according to claim 1, wherein the contact start detecting means comprises a means for detecting contact start based on a contact pressure generated between the mounting part and the mounting target part.

3. A mounting apparatus according to claim 1 or 2, wherein the contact start position detecting means comprises a means for detecting the contact start position based on a moving amount by which the one of the means to be moved moves from a predetermined reference position until the detecting of the start of contact between the mounting part and the mounting target part.

4. A mounting apparatus according to claim 1, further comprising:
a pressurizing means for causing an output member to act on one of the mounting part and the mounting target part to impart a predetermined pressurizing force between the mounting part and the mounting target part in contact with each other;
a lock means for supporting as a support portion a halfway portion of the output member from a direction opposite to a pressurizing direction to regulate relative movement of the output member in the pressurizing direction with respect to the support portion; and
a pressurizing force detecting means for detecting a pressurizing force actually acting on the output member between an end portion of the output member acting on the one of the mounting part and the mounting target part and a position of a cross section substantially perpendicular to the pressurizing direction of the output member including a support position of the lock means,
wherein, with the lock means imparting a predetermined pressurizing force to the output member of the pressurizing means while supporting the output member, the control means causes the initial movement control means and the contact movement control means to move one of the mounting part holding means and the mounting target part holding means, and
wherein the pressurizing force detecting means is caused to function as the contact start detecting means.

5. A mounting apparatus according to claim 4, further comprising:
a raising amount detecting means for detecting, as a raising amount, an amount by which the output member is deformed between a contact side end portion of the output member and the support portion due to a contact pressure generated when the mounting part comes into contact with the mounting target part; and a contact start position correcting means for correcting a contact start position detected by the contact start position detecting means based on the raising amount,
wherein, each time the contact start position is detected by the contact start position detecting means, the correction means corrects one of the predetermined initial moving amount and a predetermined initial moving amount that is obtained after correction by the correction means based on the contact start position corrected by the contact start position correcting means.

6. A mounting apparatus according to claim 5, wherein the raising amount detecting means detects the raising amount by a linear gauge.

7. A control apparatus for a mounting apparatus, comprising a control means for moving one of a mounting part holding means and a mounting target part holding means to bring a mounting part held by the mounting part holding means and a mounting target part held by the mounting target part holding means into contact with each other in a predetermined manner for a predetermined processing,
wherein information from a contact start detecting means for detecting start of contact between the mounting part and the mounting target part, and information from a contact start position detecting means for detecting a contact start position where the start of contact between the mounting part and the mounting target part is detected by the contact start detecting means, are input to the control means, and
wherein the control means comprises:
an initial movement control means for moving the one of the means to be moved from a predetermined initial position toward the other means by a predetermined initial moving amount;
a contact movement control means for moving, after movement by the predetermined initial moving amount by the initial moving means, the one of the means to be moved toward the other means in a manner different from that of the movement by the initial moving means, bringing the mounting part into contact with the mounting target part; and
a correction means for correcting, each time the contact start position is detected by the contact start position detecting means, one of the predetermined initial moving amount and a predetermined initial moving amount that is obtained after correction by the correction means based on the contact start position detected.

8. A control apparatus for a mounting apparatus according to claim 7, wherein the mounting apparatus comprises:
a pressurizing means for causing an output member to act on one of the mounting part and the mounting target part to impart a predetermined pressurizing force between the mounting part and the mounting target part in contact with each other;
a lock means for supporting as a support portion a halfway portion of the output member from a direction opposite to a pressurizing direction to regulate relative movement of the output member in the pressurizing direction with respect to the support portion; and
a pressurizing force detecting means for detecting a pressurizing force actually acting on the output member between an end portion of the output member acting on the one of the mounting part and the mounting target part and a position of a cross section substantially perpendicular to the pressurizing direction of the output member including a support position of the lock means, wherein information from a raising amount detecting means is input to the control apparatus, the raising amount detecting means being for detecting as a raising amount an amount by which the output member is deformed between a contact side end portion of the output member and the support portion due to a contact pressure generated when the mounting part and the mounting target part are brought into contact with each other, wherein the control means is equipped with a contact start position correcting means for correcting the contact start position detected by the contact start position detecting means based on the raising amount, and wherein, each time a contact start position is detected by the contact start position detecting means, the correction means corrects one of the predetermined initial moving amount and a predetermined initial moving amount that is obtained after correction by the correction based on the contact start position corrected by the contact start position correcting means.

* * * * *

UNITED STATES PATENT AND TRADEMARK OFFICE
CERTIFICATE OF CORRECTION

PATENT NO. : 7,206,671 B2  Page 1 of 1
APPLICATION NO. : 10/521457
DATED : April 17, 2007
INVENTOR(S) : Mizuno et al.

It is certified that error appears in the above-identified patent and that said Letters Patent is hereby corrected as shown below:

On the title page, Item (30), the Foreign Priority Data. Item (30) should read:
-- [30]   Foreign Application Priority Data
     Aug. 21, 2002   (JP) .........................2002-240588--

Signed and Sealed this

Twelfth Day of June, 2007

JON W. DUDAS
*Director of the United States Patent and Trademark Office*